(12) United States Patent
Lee et al.

(10) Patent No.: US 9,748,323 B2
(45) Date of Patent: Aug. 29, 2017

(54) ORGANIC LIGHT-EMITTING DIODE DISPLAY

(71) Applicant: Samsung Display Co., Ltd., Yongin-si, Gyeonggi-do (KR)

(72) Inventors: Ji-Eun Lee, Seoul (KR); Sun-Ja Kwon, Gunpo-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/139,882

(22) Filed: Apr. 27, 2016

(65) Prior Publication Data

US 2016/0322450 A1 Nov. 3, 2016

(30) Foreign Application Priority Data

Apr. 28, 2015 (KR) .................. 10-2015-0059993

(51) Int. Cl.
*H01L 29/08* (2006.01)
*H01L 29/04* (2006.01)
(Continued)

(52) U.S. Cl.
CPC ....... *H01L 27/3276* (2013.01); *G09G 3/3233* (2013.01); *H01L 27/3262* (2013.01);
(Continued)

(58) Field of Classification Search
CPC ............ H01L 27/3276; H01L 27/3262; H01L 27/3265; G09G 3/3233; G09G 3/3258;
(Continued)

(56) References Cited

U.S. PATENT DOCUMENTS

2003/0141811 A1* 7/2003 Park .................... H01L 27/1255
313/506
2005/0173703 A1* 8/2005 Lebrun ............. G02F 1/136213
257/59
(Continued)

FOREIGN PATENT DOCUMENTS

KR     10-0623728 B1    9/2006
KR  10-2009-0075517 A   7/2009
(Continued)

*Primary Examiner* — Dzung Tran
(74) *Attorney, Agent, or Firm* — Knobbe Martens Olson & Bear LLP

(57) ABSTRACT

An organic light-emitting diode display is disclosed. In one aspect, the display includes a substrate, a scan line formed over the substrate and configured to provide a scan signal, and a data line crossing the scan line and configured to provide a data voltage. A driving voltage line crosses the scan line and is configured to provide a driving voltage. The display also includes a switching transistor electrically connected to the scan line and the data line and a driving transistor electrically connected to the switching transistor and including a driving gate electrode, a driving source electrode, and a driving drain electrode. The display further includes a storage capacitor including a first storage electrode formed over the driving transistor and the driving gate electrode as a second storage electrode. The second storage electrode overlaps the first storage electrode in the depth dimension and extends from the driving voltage line.

11 Claims, 7 Drawing Sheets

(51) Int. Cl.
*H01L 27/15* (2006.01)
*H01L 29/18* (2006.01)
*H01L 27/32* (2006.01)
*G09G 3/3233* (2016.01)

(52) U.S. Cl.
CPC . *H01L 27/3265* (2013.01); *G09G 2300/0426* (2013.01); *G09G 2300/0814* (2013.01); *G09G 2300/0819* (2013.01); *G09G 2300/0852* (2013.01); *G09G 2300/0861* (2013.01); *G09G 2300/0866* (2013.01)

(58) Field of Classification Search
CPC ... G09G 2300/0426; G09G 2300/0814; G09G 2300/0819; G09G 2300/0852; G09G 2300/0861; G09G 2300/0866
USPC .......................................... 257/40, 59, 79, 88
See application file for complete search history.

(56) References Cited

U.S. PATENT DOCUMENTS

| | | | |
|---|---|---|---|
| 2007/0152217 A1* | 7/2007 | Lai | H01L 27/1225 257/59 |
| 2009/0091698 A1* | 4/2009 | Cho | G02F 1/136286 349/139 |
| 2010/0051957 A1* | 3/2010 | Kim | H01L 27/1255 257/72 |

FOREIGN PATENT DOCUMENTS

| | | |
|---|---|---|
| KR | 10-0936883 B1 | 1/2010 |
| KR | 10-2013-0110987 A | 10/2013 |
| KR | 10-2014-0018623 A | 2/2014 |

\* cited by examiner

ORGANIC LIGHT-EMITTING DIODE DISPLAY

CROSS-REFERENCE TO RELATED APPLICATION

This application claims priority to and the benefit of Korean Patent Application No. 10-2015-0059993 filed in the Korean Intellectual Property Office on Apr. 28, 2015, the entire contents of which are incorporated herein by reference.

BACKGROUND

Field

The described technology generally relates to an organic light-emitting diode display.

Description of the Related Technology

An organic light-emitting diode (OLED) includes two electrodes and an interposed organic light emitting layer. Electrons injected from a cathode electrode and holes injected from an anode electrode are bonded to each other in the organic light emitting layer to form excitons. Light is emitted when the excitons discharge energy.

The OLED display includes a matrix of pixels, thin film transistors and capacitors for driving the OLED in each pixel. The transistors typically includes a switching transistor and a driving transistor.

The driving transistor controls a driving current flowing to the OLED and stores a data voltage in the storage capacitor connected to a driving gate node of the driving transistor to be maintained during 1 frame. Accordingly, a driving current of a predetermined amount is supplied from the driving transistor to the OLED during 1 frame emission.

However, due to a parasitic capacitance formed between the driving gate node connected to the driving gate electrode of the driving transistor and the data line, the voltage change of the data line affects the voltage of the driving gate node of the driving transistor. The voltage change of the driving source electrode changes a driving current flowing to the OLED, and this phenomenon generates a horizontal line defect according to an OFF signal of a light emission control line overlapping the data line.

Also, to prevent luminance deviation depending on a kickback voltage deviation between the data lines, a predetermined load must be maintained in the data line by overlapping the data line and the driving voltage line. However, in the structure in which the driving voltage line and the data line are formed in the same layer, the driving voltage line and the data line do not overlap each other such that the predetermined load is not maintained in the data line, thereby generating a vertical line defect.

The above information disclosed in this Background section is only to enhance the understanding of the background of the disclosure, and therefore it can contain information that does not form the prior art that is already known in this country to a person of ordinary skill in the art.

SUMMARY OF CERTAIN INVENTIVE ASPECTS

One inventive aspect relates to an OLED display that can minimize horizontal line defects and the vertical line defects in a 7-mask structure.

Another aspect is an OLED display that includes a substrate; a scan line formed on the substrate and transmitting a scan signal; a data line crossing the scan line and transmitting a data voltage; a driving voltage line crossing the scan line and transmitting a driving voltage; a switching transistor connected to the scan line and the data line; a driving transistor connected to the switching transistor and including a driving gate electrode, a driving source electrode, and a driving drain electrode; a second storage electrode overlapping a first storage electrode as a driving gate electrode and forming an expansion of the driving voltage line; and an OLED electrically connected to the driving transistor, wherein the driving drain electrode overlaps a portion of the data line to form a first holding capacitor.

The data line can include a current data line transmitting a data signal to a current pixel and an adjacent data line separated from the current data line and transmitting an adjacent data signal to the adjacent pixel, and the first holding capacitor can include a first lower holding electrode that is the driving drain electrode, and a first upper holding electrode that overlaps the first lower holding electrode and is a portion of the adjacent data line.

The first upper holding electrode can be shifted to the side from the adjacent data line.

The driving source electrode can overlap the other expansion of the driving voltage line to form a second holding capacitor.

The second holding capacitor can include a second lower holding electrode as the driving source electrode, and a second upper holding electrode overlapping the second lower holding electrode and forming the other expansion of the driving voltage line.

A semiconductor including a switching channel of the switching transistor and a driving channel of the driving transistor formed on the substrate, which are separated from each other, can be further included, and the driving channel can overlap the driving gate electrode and the driving channel is a curved plane.

The first lower holding electrode and the second lower holding electrode can be formed in the same layer as the driving channel.

A gate insulating layer covering the semiconductor, and an interlayer insulating layer covering the gate insulating layer can be further included, and the first upper holding electrode and the second upper holding electrode can be formed on the interlayer insulating layer.

The scan line can be formed in the same layer as the first storage electrode, and the data line and the second storage electrode can be formed on the interlayer insulating layer.

The driving voltage line can include a first driving voltage line parallel to the data line and a second driving voltage line crossing the data line, and the first driving voltage line can be formed in the same layer as the data line, and the second driving voltage line can be formed in the same layer as the scan line.

The OLED can include a pixel electrode electrically connected to the driving transistor, an organic emission layer formed on the pixel electrode, and a common electrode formed on the organic emission layer, and an initialization voltage line formed in the same layer as the pixel electrode and transmitting an initialization voltage initializing the driving transistor can be further included.

Another aspect is an organic light-emitting diode (OLED) display comprising: a substrate; a scan line formed over the substrate and configured to provide a scan signal; a data line crossing the scan line and configured to provide a data voltage; a driving voltage line crossing the scan line and configured to provide a driving voltage; a switching transistor electrically connected to the scan line and the data line; a driving transistor electrically connected to the switching transistor and including a driving gate electrode, a driving source electrode, and a driving drain electrode; a storage capacitor including i) a first storage electrode formed over the driving transistor and ii) the driving gate electrode as a second storage electrode, wherein the second storage electrode overlaps the first storage electrode in the depth dimension of the OLED display and extends from the driving voltage line; and an OLED electrically connected to the driving transistor, wherein the driving drain electrode overlaps a first portion of the data line to form a first holding capacitor.

In the above display, the data line includes i) a current data line configured to transmit a data signal to a current pixel and ii) an adjacent data line separated from the data line and configured to transmit an adjacent data signal to an adjacent pixel, wherein the first holding capacitor includes: the driving drain electrode as a first lower holding electrode; and a first upper holding electrode overlapping the first lower holding electrode in the depth dimension of the OLED display, wherein the first upper holding electrode includes the a portion of the adjacent data line.

In the above display, the first upper holding electrode protrudes towards the data line a predetermined distance.

In the above display, the driving source electrode overlaps the a second portion of the driving voltage line in the depth dimension of the OLED display to form a second holding capacitor.

In the above display, the second holding capacitor includes: the driving source electrode as a second lower holding electrode; and a second upper holding electrode overlapping the second lower holding electrode in the depth dimension of the OLED display.

In the above display, the switching and driving transistors respectively include switching and driving channels, wherein the OLED display further comprises a semiconductor including the switching and driving channels formed over the substrate and separated from each other, wherein the driving channel overlaps the driving gate electrode, and wherein the driving channel is curved.

In the above display, the first and second lower holding electrodes are formed on the same layer as the driving channel.

The above display further comprises: a gate insulating layer covering the semiconductor; and an interlayer insulating layer covering the gate insulating layer, wherein the first and second upper holding electrodes are formed over the interlayer insulating layer.

In the above display, the scan line is formed on the same layer as the first storage electrode, wherein the data line and the second storage electrode are formed over the interlayer insulating layer.

In the above display, the driving voltage line includes a first driving voltage line substantially parallel to the data line and a second driving voltage line crossing the data line, wherein the first driving voltage line is formed on the same layer as the data line, and wherein the second driving voltage line is formed on the same layer as the scan line.

In the above display, the OLED includes a pixel electrode electrically connected to the driving transistor an organic emission layer formed on the pixel electrode and a common electrode formed on the organic emission layer, wherein the OLED display further comprises an initialization voltage line formed on the same layer as the pixel electrode and configured to provide an initialization voltage to initialize the driving transistor.

Another aspect is an organic light-emitting diode (OLED) display comprising: a first data line configured to provide a first data signal; a driving transistor including a driving drain electrode, wherein the driving drain electrode and a portion of the first data line form a first holding capacitor; a driving voltage line formed substantially parallel to the first data line; and a switching transistor electrically connected to the first data line and including a switching drain electrode, wherein the switching drain electrode and a portion of the driving voltage line form a second holding capacitor.

In the above display, the driving transistor includes a driving gate electrode, wherein the driving gate electrode and the driving voltage line form a storage capacitor.

In the above display, the driving transistor further includes a driving source electrode, wherein the driving source electrode and the switching drain electrode are directly connected to each other.

In the above display, the first hold capacitor is configured to hold a charge and provide the charge to the first data line.

The above display further comprises a second data line separated from the first data line and configured to provide a second data signal, wherein the first holding capacitor is configured to hold a first charge and provide the first charge to the second data line.

In the above display, the driving source and drain electrodes are formed on the same layer, wherein a portion of the second data line and the portion of the driving voltage line are formed on the same layer.

In the above display, the storage capacitor includes first and second storage electrodes, wherein the second storage electrode is formed on the same layer as the portion of the second data line and the portion of the driving voltage line.

The OLED display of claim 18, wherein the first storage electrode is formed on a different layer than the driving source and drain electrodes.

The OLED display of claim 19, wherein the second storage electrode overlaps the first storage electrode in the depth dimension of the OLED display.

According to at least one of the disclosed embodiments, the portion of the adjacent data line and the driving drain electrode overlap each other to form the first holding capacitor, such that the predetermined load is obtained by the adjacent data line, thereby minimizing the vertical line defect.

Also, a portion of the driving voltage line and the driving source electrode can overlap each other to form the second holding capacitor, such that the parasitic capacitor is shielded between the current data line and the driving source electrode, thereby minimizing the horizontal line defect.

DETAILED DESCRIPTION OF CERTAIN INVENTIVE EMBODIMENTS

Figure 1:
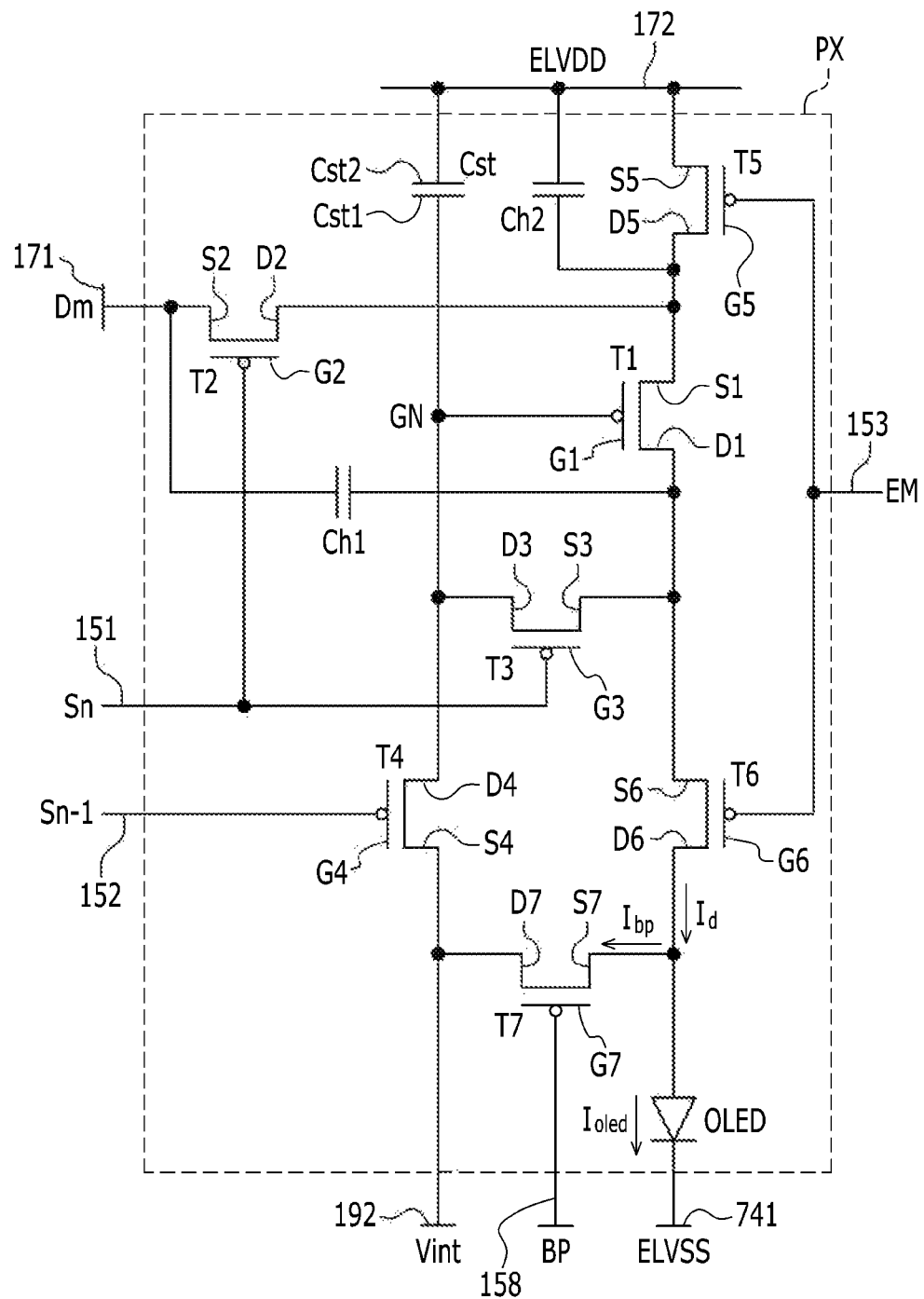
FIG. 1 is an equivalent circuit diagram of a pixel of an OLED display according to an exemplary embodiment of the present disclosure.

The present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

In order to clearly describe the present disclosure, portions that are not related to the description will be omitted. Like reference numerals designate like elements throughout the specification.

In addition, the size and thickness of each configuration shown in the drawings are arbitrarily shown for understanding and ease of description, but the present disclosure is not necessarily limited thereto. In the drawings, the thickness of layers, films, panels, regions, etc., are exaggerated for clarity. In the drawings, the thickness of layers, films, panels, regions, etc., are also exaggerated for ease of description.

In addition, unless explicitly described to the contrary, the word "comprise" and variations such as "comprises" or "comprising", will be understood to imply the inclusion of stated elements but not the exclusion of any other elements. Further, it will be understood that when an element such as a layer, film, region, or substrate is referred to as being "on" another element, it can be directly on the other element or intervening elements can also be present. Further, in the specification, the word "on" means positioning on or below the object portion, but does not necessarily mean positioning on the upper side of the object portion based on a gravitational direction.

Further, in the specification, the word "in plan view" means when an object portion is viewed from the above, and the word "in cross section" means when a cross section taken by vertically cutting an object portion is viewed from the side.

Further, the number of thin film transistors (TFTs) and capacitors is not limited to the number illustrated in the accompanying drawings, and an OLED display can be formed in various structures in which one pixel can include a plurality of transistors and at least one capacitor, and is further provided with separate wiring or does not include existing wirings. Here, a pixel means a minimum unit which displays an image and the organic light emitting device displays an image through a plurality of pixels. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Hereinafter, an OLED display according to an exemplary embodiment of the present disclosure will be described with reference to the accompanying drawings.

FIG. 1 is an equivalent circuit diagram of a pixel of an OLED display according to an exemplary embodiment of the present disclosure.

As shown in FIG. 1, the OLED display according to an exemplary embodiment of the present disclosure includes a plurality of signal lines 151, 152, 153, 158, 171, 172, and 192, and a plurality of pixels PX arranged in a matrix and connected to the plurality of signal lines.

One pixel PX includes a plurality of transistors T1, T2, T3, T4, T5, T6, and T7, a storage capacitor Cst, a first holding capacitor Ch1, a second holding capacitor Ch2, and an OLED, which are connected to the signal lines 151, 152, 153, 158, 171, 172, and 192.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 which transfers a scan signal Sn, a front end scan line 152 which transfers a front end scan signal Sn-1 to the initialization transistor T4, a light emission control line 153 which transfers a light emitting control signal EM to the operation control transistor T5 and the light emission control transistor T6, a bypass control layer 158 which transfers a bypass signal BP to the bypass transistor T7, a data line 171 which intersects the scan line 151 and transfers a data signal Dm, a driving voltage line 172 which transfers a driving voltage ELVDD and is formed substantially parallel to the data line 171, and an initialization voltage line 192 which transfers an initialization voltage Vint initializing the driving transistor T1.

A gate electrode G1 of the driving transistor T1 is connected to one terminal Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives the data signal Dm depending on a switching operation of the switching transistor T2 to supply a driving current $I_d$ to the OLED.

A gate electrode G2 of the switching transistor T2 is connected to the scan line 151, a source electrode S2 of the switching transistor T2 is connected to the data line 171, and a drain electrode D2 of the switching transistor T2 is connected to the driving voltage line 172 via the operation control transistor T5, while being connected to the source electrode S1 of the driving transistor T1. The switching transistor T2 is turned on depending on the scan signal Sn which is transferred through the scan line 151 to perform a switching operation of transferring the data signal Dm transferred to the data line 171 to the source electrode S1 of the driving transistor T1.

A gate electrode G3 of the compensation transistor T3 is connected to the scan line 151, a source electrode S3 of the compensation transistor T3 is connected to the anode of the OLED via the light emission transistor T6 while being connected to the drain electrode D1 of the driving transistor T1, and a drain electrode D3 of the compensation transistor T3 is connected to each of a drain electrode D4 of the initialization transistor T4, one terminal Cst1 of the storage capacitor Cst, and the gate electrode G1 of the driving transistor T1. The compensation transistor T3 is turned on depending on the scan signal Sn, which is transferred through the scan line 151 to connect the gate electrode G1 and the drain electrode D1 of the driving transistor T1 so as to diode-connect the driving transistor T1.

A gate electrode G4 of the transistor T4 is connected to the front end scan line 152, the source electrode S4 of the initialization transistor T4 is connected to the initialization voltage line 192, and the drain electrode D4 of the initialization transistor T4 is connected to both one terminal Cst1 of the storage capacitor Cst via the drain electrode D3 of the compensation transistor T3 and the gate electrode G1 of the driving transistor T1. The initialization transistor T4 is turned on depending on the front end scan signal Sn-1, which is transferred through the front end scan line 152 to transfer the initialization voltage Vint to the gate electrode G1 of the driving transistor T1 so as to perform the initialization operation, which initializes a gate voltage Vg of the gate electrode G1 of the driving transistor T1.

A gate electrode G5 of the operation control transistor T5 is connected to the light emission control line 153, the source electrode S5 of the operation control transistor T5 is connected to the driving voltage line 172, and the drain electrode D5 of the operation control transistor T5 is connected to the source electrode S1 of the driving transistor T1 and the drain electrode S2 of the switching transistor T2.

A gate electrode G6 of the light emission transistor T6 is connected to the light emission control line 153, a source electrode S6 of the light emission transistor T6 is connected to the drain electrode D1 of the driving transistor T1 and the source electrode S3 of the compensation transistor T3, and a drain electrode D6 of the light emission transistor T6 is electrically connected to the anode of the OLED. The operation control transistor T5 and the light emission control transistor T6 are substantially simultaneously (or concurrently) turned on depending on the light emission control signal EM, which is transferred through the light emission control line 153, and thus the driving voltage ELVDD is compensated by the diode-connected driving transistor T1 and then is transferred to the OLED.

A gate electrode G7 of the bypass transistor T7 is connected to the bypass control line 158, a source electrode S7 of the bypass transistor T7 is connected to both the drain electrode D6 of the light emission control transistor T6 and the anode of the OLED, and a drain electrode D7 of the bypass transistor T7 is connected to both the initialization voltage line 192 and the source electrode S4 of the initialization transistor T4.

The other terminal Cst2 of the capacitor Cst is connected to the driving voltage line 172 and a cathode of the OLED is connected to the common voltage line 741, through which a common voltage ELVSS is transferred.

The first holding capacitor Ch1 is formed between the data line 171 and the drain electrode D1 of the driving transistor T1, which overlap each other, and the second holding capacitor Ch2 is formed between the driving voltage line 172 and the source electrode S1 of the driving transistor T1, which overlap each other.

Meanwhile, in the exemplary embodiment of the present disclosure, the seven-transistor and three-capacitor structure including the bypass transistor T7 is illustrated, but the present disclosure is not limited thereto, and the number of transistors and the number of capacitors can be variously changed.

Hereinafter, a detailed operation process of one pixel of the OLED display according to the exemplary embodiment of the present disclosure will be described in detail with reference to FIG. 2.

Figure 2:
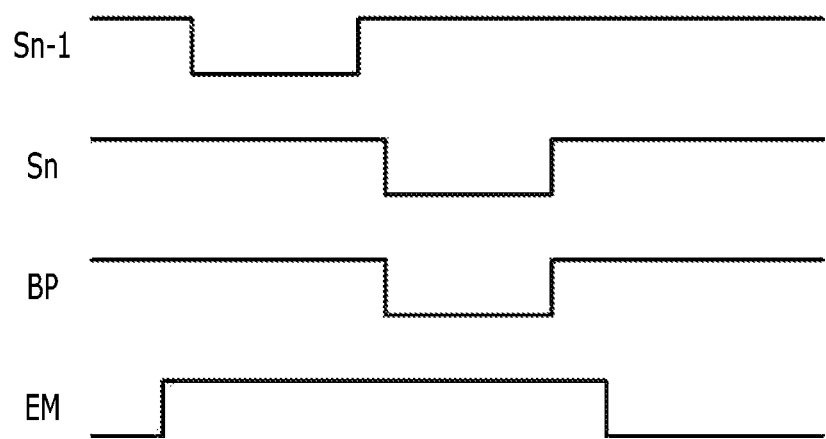
FIG. 2 is a timing diagram of a signal applied to a pixel of an OLED display according to an exemplary embodiment of the present disclosure.

FIG. 2 is a timing diagram of a signal applied to a pixel of an OLED display according to an exemplary embodiment of the present disclosure.

As illustrated in FIG. 2, the previous low-level scan signal Sn-1 is supplied through the previous scan line 152 for an initialization period. Next, the initialization transistor T4 is turned on depending on the low-level front end scan signal Sn-1, the initialization voltage Vint is connected to the gate electrode G1 of the driving transistor T1 from the initialization voltage line 192 through the initialization transistor T4, and the driving transistor T1 is initialized by the initialization voltage Vint.

Next, the low-level scan signal Sn is supplied through the scan line 151 for a data programming period. Next, the switching transistor T2 and the compensation transistor T3 are turned on depending on the low-level scan signal Sn. In this case, the driving transistor T1 is diode-connected by the turned on compensation transistor T3 and is biased forward.

Next, a compensation voltage Dm+Vth (Vth is a negative value), which is reduced by as much as a threshold voltage (Vth) of the driving transistor T1 from the data signal Dm supplied from the data line 171, is applied to the gate electrode G1 of the driving transistor T1. That is, the gate voltage Vg which is applied to the gate electrode G1 of the driving transistor T1 is the compensation voltage Dm+Vth.

The driving voltage ELVDD and the compensation voltage Dm+Vth are applied to both terminals of the storage capacitor Cst, and a charge corresponding to the difference in voltage between both terminals of the storage capacitor Cst is stored in the storage capacitor Cst.

Next, the light control signal EM supplied from the light emission control line 153 is changed from a high level to a low level for a light emission period. Next, the operation control transistor T5 and the light control transistor T6 are turned on by the low-level light emission control signal Em for the light emission period.

Next, a driving current $I_d$ corresponding to a voltage difference between the gate voltage Vg of the gate electrode G1 of the driving transistor T1 and the driving voltage ELVDD is generated and the driving current $I_d$ is supplied to the OLED (OLED) through the light emission control transistor T6. A driving gate-source voltage Vgs of the driving transistor T1 is maintained at 'Dm+Vth−ELVDD' by the storage capacitor Cst for the light emission period, and depending on a current-voltage relationship of the driving transistor T1, the driving current $I_d$ is proportional to a square of '(Dm−ELVDD)2' of a value obtained by subtracting the threshold voltage from the driving gate-source voltage Vgs. Therefore, the driving current $I_d$ is determined independent of the threshold voltage Vth of the driving transistor T1.

In this case, the bypass transistor T7 receives a bypass signal BP from the bypass control line 158. Accordingly, the driving current $I_d$ is partially discharged through the bypass transistor T7 as a bypass current $I_{bp}$.

When the OLED emits light even though a minimum current of the driving transistor T1 displaying a black image flows as a driving current, the black image is not properly displayed. Therefore, the bypass transistor T7 can disperse some of the minimum current of the driving transistor T1 to current paths other than a current path to the OLED as the bypass current $I_{bp}$. Here, the minimum current of the driving transistor T1 means a current for which the driving gate-source voltage Vgs of the driving transistor T1 is less than the threshold voltage Vth, and thus the driving transistor T1 is turned off. The minimum driving current (e.g., a current which is equal to or less than about 10 pA) for which the driving transistor T1 is turned off is transferred to the OLED and is represented by an image of black luminance. When the minimum driving current representing the black image flows, the effect of the bypass transfer of the bypass current $I_{bp}$ is significant, but when a large driving current representing an image like a general image or a white image flows, an effect of the bypass current $I_{bp}$ can be minimal. Therefore, when the driving current representing the black image flows, a light emitting current $I_{old}$ of the OLED, which is reduced by as much as a current amount of the bypass current $I_{bp}$ which exits from the driving current $I_d$ through the bypass transistor T7, has a minimum current amount that is at a level sufficient to represent the black image. Therefore, an accurate black luminance image is achieved by using the bypass transistor T7 to improve contrast ratio. In FIG. 2, the bypass signal BP is the same as the scan signal Sn, but is not necessarily limited thereto.

Next, the detailed structure of the outermost pixel PX2 among the pixels of the OLED display illustrated in FIG. 1 and FIG. 2 will be described in detail with reference to FIG. 3, FIG. 4, FIG. 5, FIG. 6, and FIG. 7.

Figure 3:
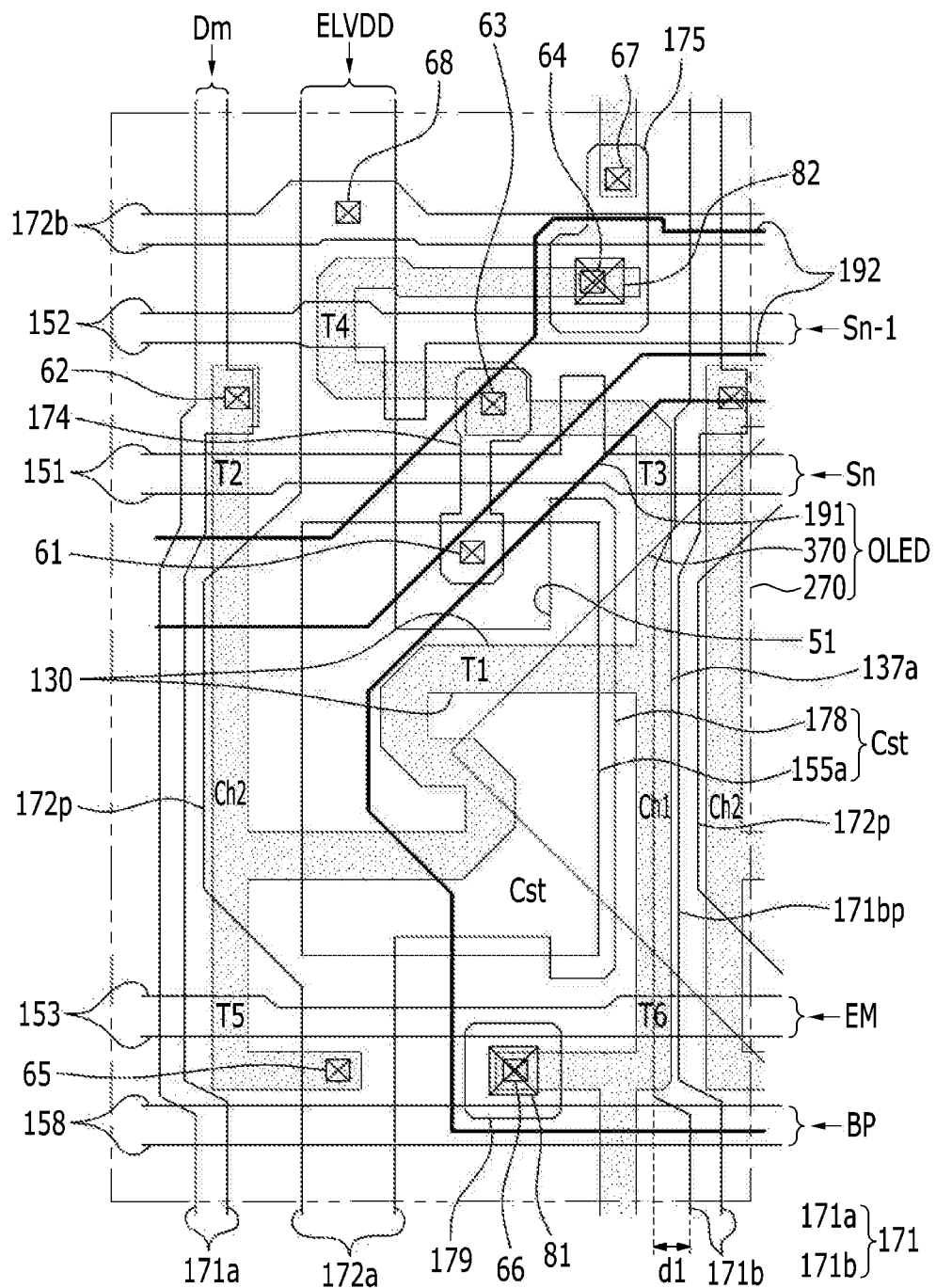
FIG. 3 is a schematic view of a plurality of transistors and capacitors of an OLED display according to an exemplary embodiment of the present disclosure.
Figure 4:
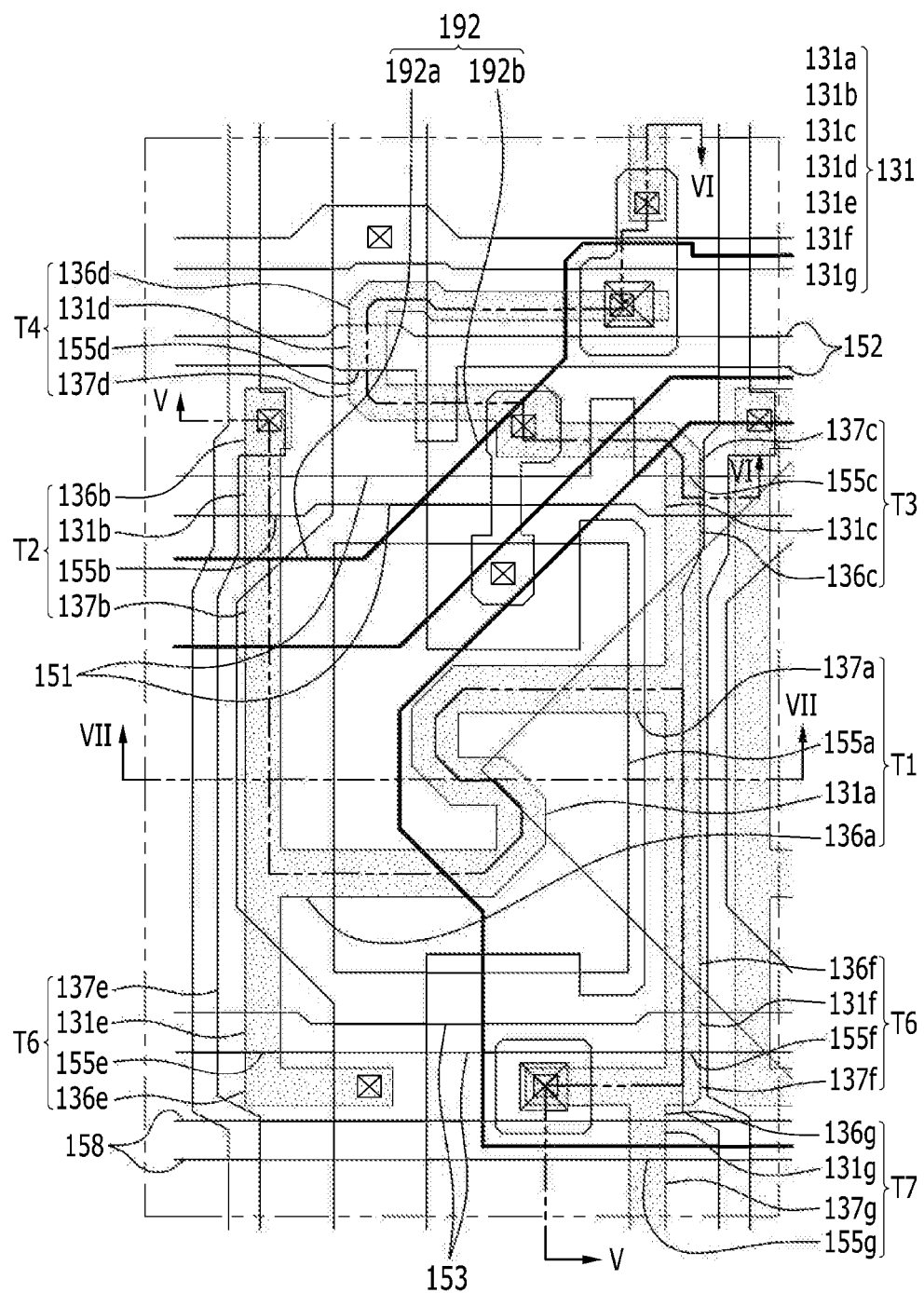
FIG. 4 is a detailed layout view of FIG. 3.
Figure 5:
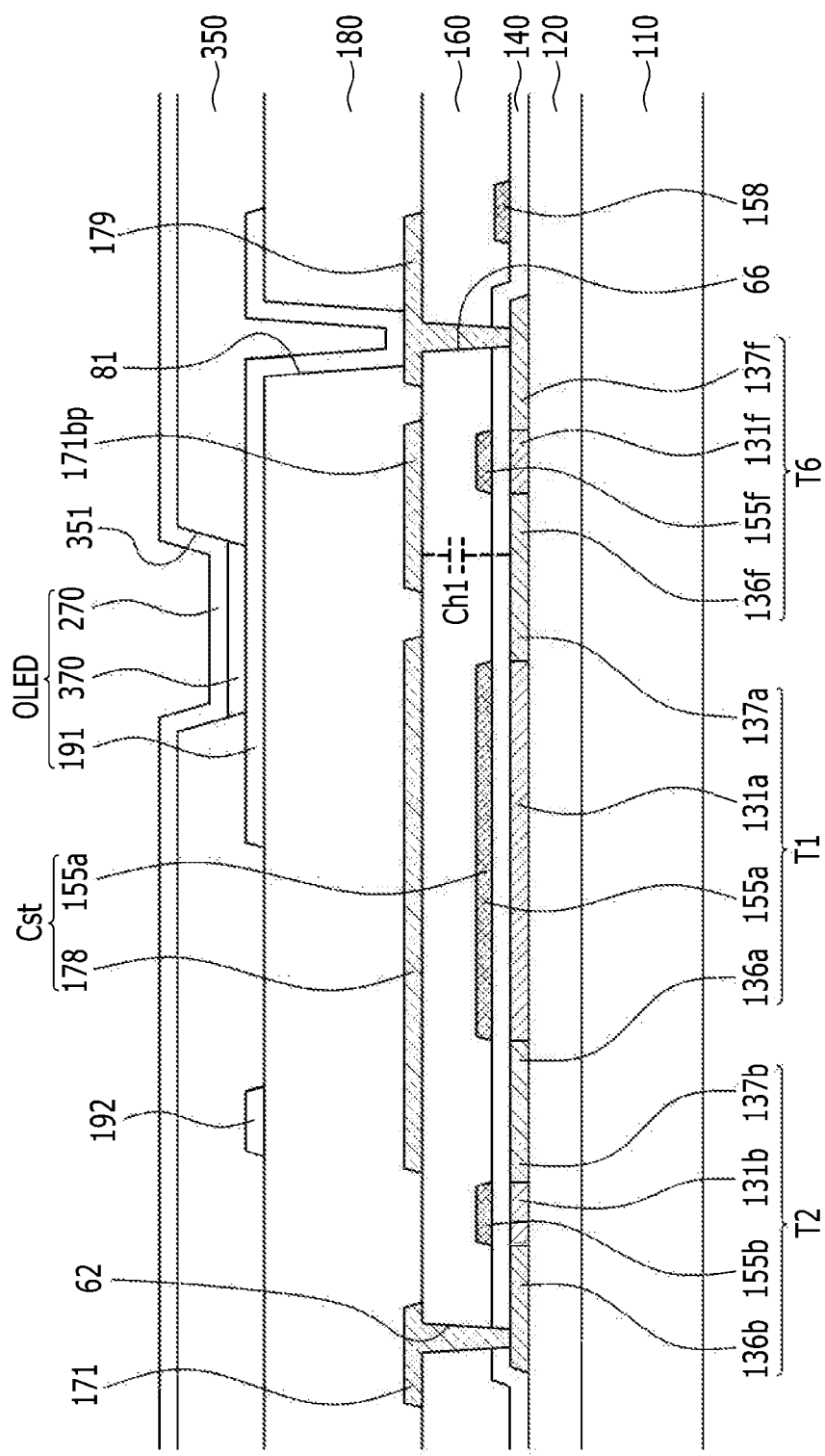
FIG. 5 is a cross-sectional view of the OLED display of FIG. 4 taken along line V-V.
Figure 6:
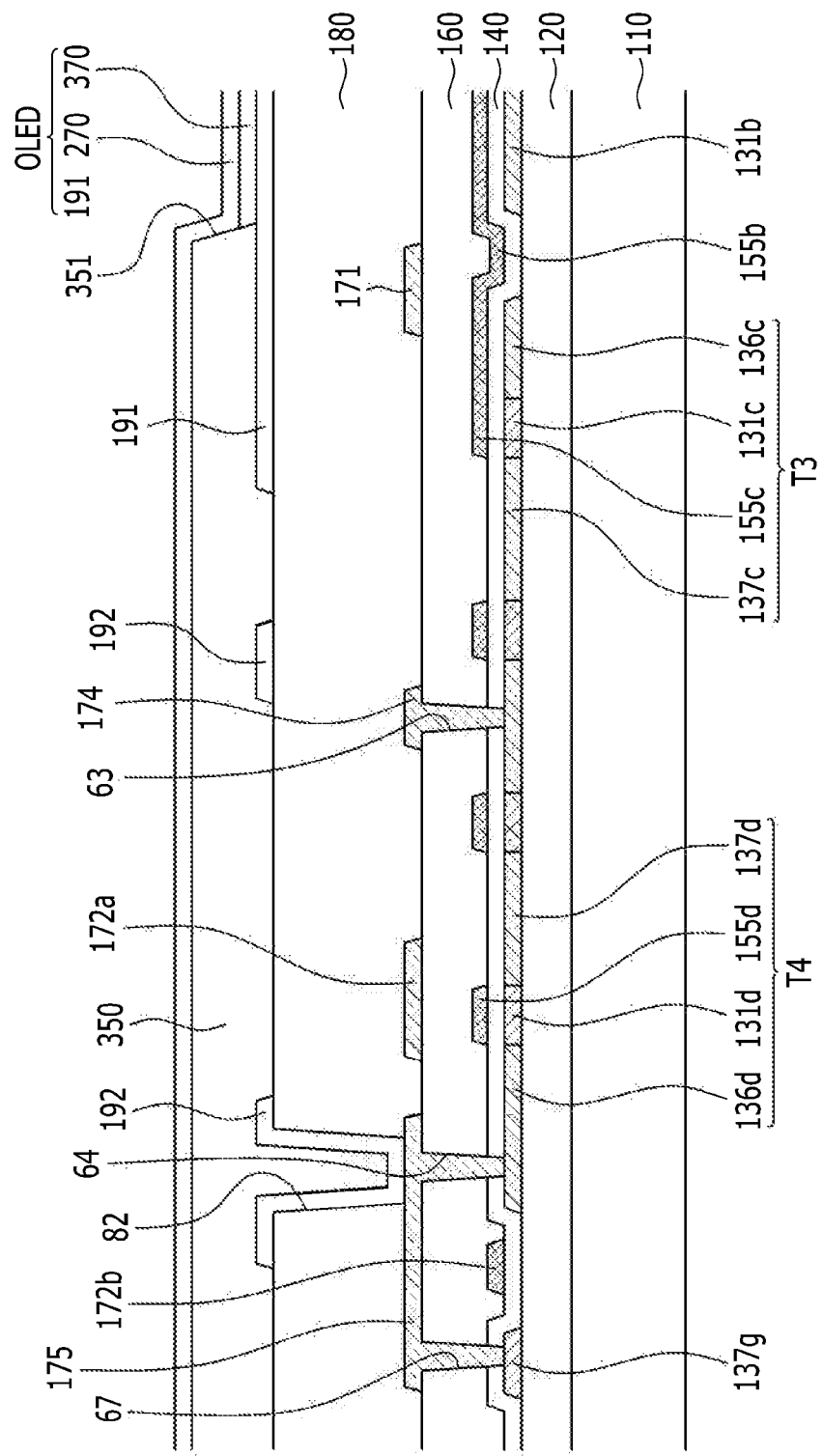
FIG. 6 is a cross-sectional view of the OLED display of FIG. 4 taken along line VI-VI.
Figure 7:
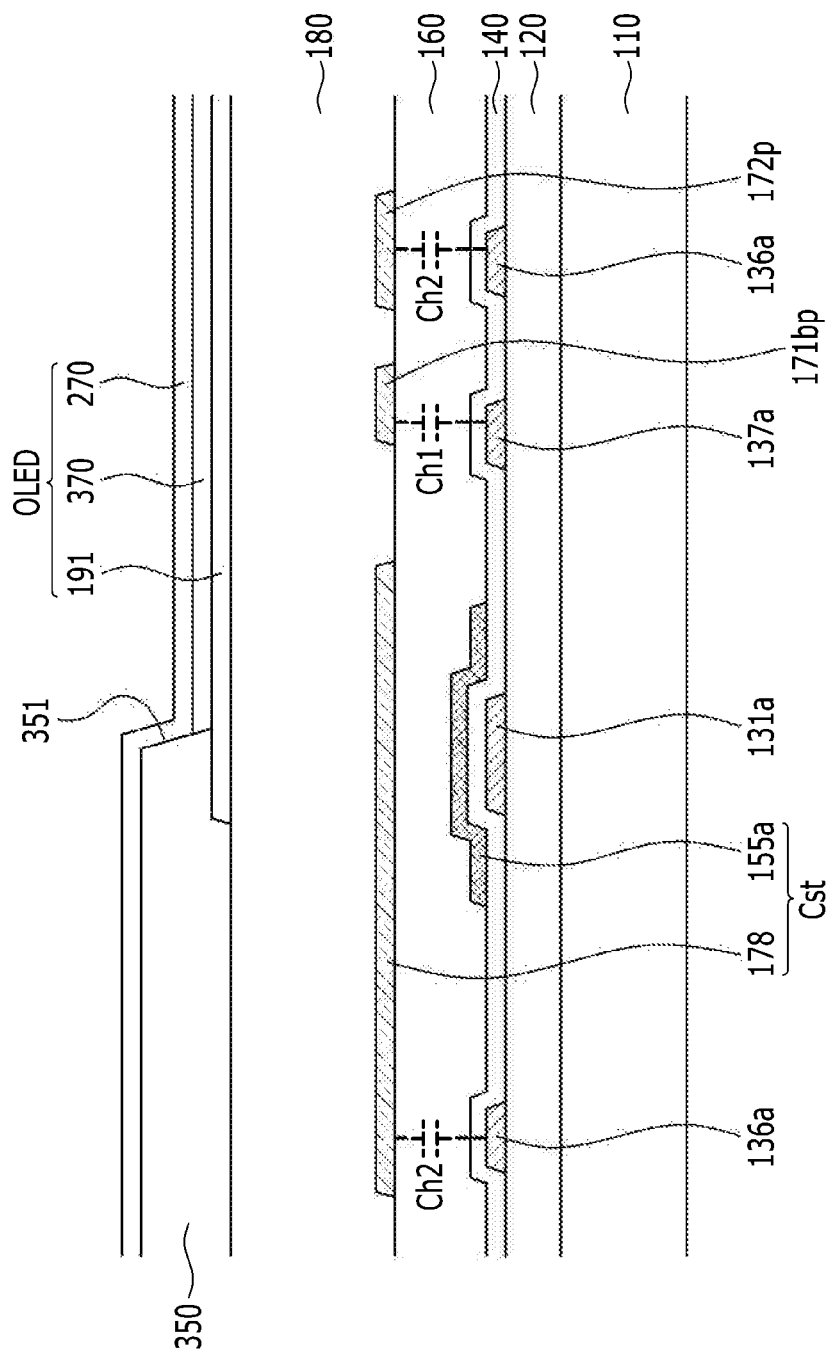
FIG. 7 is a cross-sectional view of the OLED display of FIG. 4 taken along line VII-VII.

FIG. 3 is a schematic view of a plurality of transistors and capacitors of an OLED display according to an exemplary embodiment of the present disclosure. FIG. 4 is a detailed layout view of FIG. 3. FIG. 5 is a cross-sectional view of the OLED display of FIG. 4 taken along line V-V, FIG. 6 is a cross-sectional view of the OLED display of FIG. 4 taken along line VI-VI. FIG. 7 is a cross-sectional view of the OLED display of FIG. 4 taken along line VII-VII.

Hereinafter, the detailed plane structure of the OLED display according to the exemplary embodiment of the present disclosure will first be described with reference to FIG. 3 and FIG. 4, and the detailed cross section of the structure will be described with reference to FIG. 5, FIG. 6, and FIG. 7.

As shown in FIG. 3 and FIG. 4, the OLED display according to an exemplary embodiment of the present disclosure includes a scan line 151, a previous scan line 152, an emission control line 153, and a bypass control line 158, which respectively transmit a scan signal Sn, a previous scan signal Sn-1, an emission control signal EM, and a bypass signal BP to the pixel PX, and which are formed along a row direction. A data line 171 and a driving voltage line 172 intersect the scan line 151, the previous scan line 152, the light emission control line 153, and the bypass control line 158. The lines 171 and 172 can apply the data signal Dm and the driving voltage ELVDD to the pixel 1. The driving voltage line 172 is made of a first driving voltage line 172a substantially parallel to the data line 171 and a second driving voltage line 172b substantially parallel to the scan line 151. The first driving voltage line 172a and the second driving voltage line 172b are connected through the contact hole 68. Accordingly, compared to the case in which the first driving voltage line 172a is only formed to extend in a vertical direction to transmit the driving voltage, an exemplary embodiment of the present disclosure connects the first driving voltage line 172a elongated in a vertical direction and the second driving voltage line 172b elongated in a horizontal direction through the contact hole 68 to form a mesh structure, thereby minimizing the voltage drop of the driving voltage line 172.

The initialization voltage Vint is transferred from the initialization voltage line 192 to the compensation transistor T3 via the initialization transistor T4. The initialization voltage line 192 alternately includes a straight portion and an oblique portion. The straight portion 192a is formed to be substantially parallel to the scan line 121 and the oblique portion 192b extends at a predetermined angle to the straight portion 192a.

Also, the pixel PX is provided with the driving transistor T1, the switching transistor T2, the compensation transistor T3, the initialization transistor T4, the operation control transistor T5, the light emission control transistor T6, the bypass transistor T7, the storage capacitor Cst, the first holding capacitor Ch1, the second holding capacitor Ch2, and the OLED.

The OLED includes the pixel electrode 191, the organic emission layer 370, and the common electrode 270. In this case, the compensation transistor T3 and the initialization transistor T4 are comprised of a transistor having a dual gate structure to cut off current leakage.

Each channel of the driving transistor T1, the switching transistor T2, the compensation transistor T3, the initialization transistor T4, the operation control transistor T5, the light emission control transistor T6, and the bypass transistor T7 is formed inside one connected semiconductor 130, which can be bent in various shapes. The semiconductor 130 can be formed of polysilicon or an oxide semiconductor. The oxide semiconductor can include one of oxides based on titanium (Ti), hafnium (Hf), zirconium (Zr), aluminum (Al), tantalum (Ta), germanium (Ge), zinc (Zn), gallium (Ga), tin (Sn), or indium (In), zinc oxide (ZnO), indium-gallium-zinc oxide (InGaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and hafnium-indium-zinc oxide (Hf—In—Zn—O) which are complex oxides thereof. In the case the semiconductor 130 is formed of an oxide semiconductor material, a separate passivation layer for protecting the oxide semiconductor material, which is vulnerable to external influences such as a high temperature, can be added.

The semiconductor 130 includes a channel, which is doped with an N-type impurity or a P-type impurity, and a source doping part and a drain doping part which are formed at respective sides of the channel and doped with a type of doping impurity opposite to the doping impurity doped on the channel. In the exemplary embodiment, the source doping part and the drain doping part correspond to the source electrode and the drain electrode, respectively. The source electrode and the drain electrode formed in the semiconductor 130 can be formed by doping only the corresponding regions. Further, in the semiconductor 130, a region between source electrodes and drain electrodes of different transistors is doped, and thus the source electrode and the drain electrode can be electrically connected to each other.

As illustrated in FIG. 4, the channel 131 includes a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a can be curved and can have a meandering shape or a zigzag shape. As such, by forming the curved driving channel 131a, the driving channel 131a can be formed to be elongated in a narrow space. Accordingly, a driving range of the driving gate-source voltage Vgs between the driving gate electrode 155a and the driving source electrode 136a is increased by the elongated driving channel 131a. Since the driving range of the gate voltage is increased, a gray scale of light emitted from the OLED can be finely controlled by changing the magnitude of the gate voltage, and as a result, the resolution of the OLED display device can be enhanced and display quality can be improved. Various shapes, such as a 'reverse S', 'S', 'M', and 'W', can be implemented by variously modifying the shape of the driving channel 131a.

The driving gate electrode 155a overlaps the driving channel 131a, and the driving source electrode 136a and the driving drain electrode 137a are formed at respective sides of the driving channel 131a to be close. The driving gate electrode 155a is connected to the first data connecting member 174 through a contact hole 61.

The switching transistor T2 includes the switching channel 131b, a switching gate electrode 155b, a switching source electrode 136b, and a switching drain electrode 137b. The switching gate electrode 155b, as a portion of the scan line 151, overlaps the switching channel 131b. The switching source electrode 136b and the switching drain electrode 137b are formed to be adjacent to both sides of the switching channel 131b. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c that is a part of the scan line 151 is formed in two in order to prevent current leakage, and it overlaps the compensation channel 131c. The compensation source electrode 136c and the compensation drain electrode 137c are formed to be adjacent to respective sides of the compensation channel 131c. The compensation drain electrode 137c is connected to a driving connecting member 174 through a contact hole 63.

The initialization transistor T4 includes the initialization channel 131d, an initialization gate electrode 155d, an initialization source electrode 136d, and an initialization drain electrode 137d. The initialization gate electrode 155d that is a part of the previous scan line 152 is formed in two in order to prevent current leakage, and it overlaps the initialization channel 131d. The initialization source electrode 136d and the initialization drain electrode 137d are formed to be adjacent to respective sides of the initialization channel 131d. The initialization source electrode 136d is connected to an initialization connecting member 175 through a contact hole 64.

The operation control transistor T5 includes the operation control channel 131e, an operation control gate electrode 155e, an operation control source electrode 136e, and an operation control drain electrode 137e. The operation control gate electrode 155e that is a part of the light emission control line 153 overlaps the operation control channel 131e, and the operation control source electrode 136e and the operation control drain electrode 137e are formed to be adjacent to respective sides of the operation control channel 131e. The operation control source electrode 136e is connected to a driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f that is a part of the light emission control line 153 overlaps the light emission control channel 131f, and the light emission control source electrode 136f and the light emission control drain electrode 137f are formed to be adjacent to respective sides of the light emission control channel 131f. The light emission control drain electrode 137f is connected to the third data connecting member 179 through a contact hole 66.

The bypass transistor T7 includes the bypass channel 131g, a bypass gate electrode 155g, a bypass source electrode 136g, and a bypass drain electrode 137g. The bypass gate electrode 155g that is a part of the bypass control line 158 overlaps the bypass channel 131g, and the bypass source electrode 136g and the bypass drain electrode 137g are formed to be adjacent to respective sides of the bypass channel 131g.

The bypass source electrode 136g is directly connected to the light emission control drain electrode 137f, and the bypass drain electrode 137g is connected to the initialization connecting member 175 through the contact hole 67.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 178 including an interlayer insulating layer 160 interposed therebetween. The first storage electrode 155a corresponds to the driving gate electrode 155a, and the second storage electrode 178 is an expansion region of the first driving voltage line 172a and is formed one per pixel. Here, the gate insulating layer 160 becomes a dielectric material, and a storage capacitance is determined by a charge charged to the storage capacitor Cst and a voltage between the electrodes 155a and 156. As described above, by using the driving gate electrode 155a as the first storage electrode 155a, a space for forming the first storage capacitor can be obtained in the space that is decreased by the driving channel 131a occupying a large area in the pixel.

The first storage electrode 155a, as the driving gate electrode 155a, is connected to one end of the driving connecting member 174 through the contact hole 61 and the storage groove 51. The storage groove 51 is a groove formed in the second storage electrode 178. Accordingly, the contact hole 61 connecting one end of the driving connecting member 174 and the driving gate electrode 155a is formed inside the storage groove 51. The driving connecting member 174 is substantially parallel to the data line 171 and is formed in the same layer. The other end of the driving connecting member 174 is connected to the compensation drain electrode 137c of the compensation transistor T3 and the initialization drain electrode 137d of the initialization transistor T4 through the contact hole 63. Accordingly, the driving connecting member 174 connects the driving gate electrode 155a and the compensation drain electrode 137c of the compensation transistor T3 and the initialization drain electrode 137d of the initialization transistor T4 to each other. The driving connecting member 174 corresponds to a driving gate node GN in the equivalent circuit diagram of FIG. 1.

The first upper storage electrode 178 is an expansion extending from the first driving voltage line 172a on the driving gate electrode 155a. Accordingly, the storage capacitor Cst stores the storage capacitance corresponding to the difference between the driving voltage ELVDD transmitted to the second storage electrode 178 through the driving voltage line 172 and the gate voltage Vg of the driving gate electrode 155a. As described above, by forming the portion of the driving voltage line as the second storage electrode 178, it is not necessary that the second storage electrode be formed as a separate layer, and the number of masks used in the manufacturing thereof can be reduced. In this case, a total of 7 masks are used from the semiconductor 130 to the common electrode 270, and this manufacturing method is referred to as a 7 mask process, while the structure of the OLED display manufactured by the 7 mask process is referred to as a 7 mask structure.

The data line 171 crosses the scan line 151 and extends in the column direction. The data line 171 includes a current data line 171a transmitting a data signal Dm to the current pixel and an adjacent data line 171b transmitting an adjacent data signal D(m+1) to the adjacent pixel.

In this case, the portion 171bp of the adjacent data line between the previous scan line 152 and the bypass control line 158 is shifted by a predetermined interval dl to a side. Accordingly, the adjacent data line 171b overlaps the driving drain electrode 137a of the current pixel, thereby forming the first holding capacitor Ch1. That is, the first holding capacitor Ch1 includes the driving drain electrode 137a as a first lower holding electrode 137a and a first upper holding electrode 171bp that overlaps the first lower holding electrode 137a and is a portion of the adjacent data line 171b. As described above, the adjacent data line 171b obtains a predetermined load from the first holding capacitor Ch1 formed by partially overlapping the adjacent data line 171b and the driving drain electrode 137a, thereby minimizing a vertical line defect.

The first driving voltage line 172a is separated from the data line 171 and extends in the column direction. One expansion (or extended portion) of the first driving voltage line 172a expands on the driving gate electrode 155a to form the second storage electrode 178, and the other expansion 172p of the first driving voltage line 172a expands on the driving source electrode 136a to overlap the driving source electrode 136a, thereby forming the second holding capacitor Ch2. The second hold capacitor Ch2 can hold a charge and provide the charge to the current data line. That is, the second holding capacitor Ch2 includes the second lower holding electrode 136a as the driving source electrode 136a and the second upper holding electrode 172p that overlaps the second lower holding electrode 136a and is the other portion of the first driving voltage line 172a.

As described above, by overlapping the other expansion 172p of the vertical driving voltage line with the driving source electrode 136a to form the second holding capacitor, the parasitic capacitor between the current data line and the driving source electrode is prevented, such that the influence of the voltage change of the data line for the driving source electrode is minimized, thereby minimizing the horizontal line defect.

The parasitic capacitor Ca is generated between the data line 171 and the driving connecting member 174, and the parasitic capacitor Ca affects the change of the data signal Dm and the adjacent data signal D(m+1) of the data line 171 to the driving connecting member 174. Accordingly, the driving gate voltage Vg of the driving gate electrode 155a connected to the driving connecting member 174 is changed to affect luminance, such that vertical crosstalk is generated.

However, in an exemplary embodiment of the present disclosure, a shielding member connected to the second storage electrode that is a portion of the first driving voltage line 172a applied with the driving voltage ELVDD is positioned between the driving connecting member 174 and the data line 171. Accordingly, the shielding member transmitted with the driving voltage shields the driving connecting member 174 and the data line 171 from each other, such that the parasitic capacitor between the driving connecting member 174 and the data line 171 is removed.

Accordingly, the kickback voltage due to the parasitic capacitor is minimized such that the change of the driving gate voltage Vg of the driving gate electrode 155a connected to the driving connecting member 174 as the driving gate node GN is decreased, thereby minimizing vertical crosstalk.

On the other hand, the rectangular light emission control connecting member 179 is connected to the pixel electrode 191 through the contact hole 81, and the initialization connecting member 175 is connected to the initialization voltage line 192 through the contact hole 82.

Hereinafter, the cross section structure of the OLED display according to the exemplary embodiment of the present disclosure will be described in detail according to the stacked order with reference to FIG. 5, FIG. 6, and FIG. 7.

In this case, the operation control transistor T5 is substantially the same as the stacked structure of the light emission control transistor T6 and therefore a detailed description thereof will be omitted.

A buffer layer 120 is formed on the substrate 110. The substrate 110 can be formed as an insulating substrate, which is formed of glass, quartz, ceramic, plastic, or the like. The buffer layer 120 serves to block impurities from the substrate 110 to improve characteristics of polysilicon at the time of the crystallization process for forming polysilicon and planarizing the substrate 110 to mitigate stress of the semiconductor formed on the buffer layer 120. The buffer layer 120 can be formed silicon nitride (SiNx), silicon oxide SiO2, or the like.

A semiconductor 130, which includes a channel 131 including a driving channel 131a, a switching channel 131b, a compensation channel 131c, an initialization channel 131d, an operation control channel 131e, a light emission control channel 131f, and a bypass channel 131g, is formed on the buffer layer 120. The driving source electrode 136a and the driving drain electrode 137a are formed at both sides of the driving channel 131a among the semiconductor 130. The switching source electrode 136b and the switching drain electrode 137b are formed at both sides of the switching channel 131b. Further, the compensation source electrode 136c and the compensation drain electrode 137c are formed at both sides of the compensation channel 131c, and the initialization source electrode 136d and the initialization drain electrode 137d are formed at both sides of the initialization channel 131d. Further, the operation control source electrode 136e and the operation control drain electrode 137e are formed at both sides of the operation control channel 131e The light emission control source electrode 136f and the light emission control drain electrode 137f are formed at both sides of the light emission control channel 131f. The bypass source electrode 136g and the bypass drain electrode 137g are formed at both sides of the bypass channel 131g.

A gate insulating layer 140 covering the semiconductor 130 is formed thereon. Metal gate lines 151, 152, 153, 158, and 155a include a scan line 151 including a switching gate electrode 155b and a compensation gate electrode 155c, a previous scan line 152 including an initialization gate electrode 155d, a light emission control line 153 including an operation control gate electrode 155e and a light emission control gate electrode 155f, a bypass control line 158 including a bypass gate electrode 155g, and a driving gate electrode (a first storage electrode) 155a. The metal gate lines 151, 152, 153, 158, and 155a can be formed in multiple layers, in which metal layers formed of any one of copper (Cu), copper alloy, aluminum (Al), aluminum alloy, molybdenum (Mo), and molybdenum alloy are stacked.

An interlayer insulating layer 160 covering the metal gate lines 151, 152, 153, 158, and 155a, and the gate insulating layer 140 is formed thereon. The interlayer insulating layer 160 can be formed of silicon nitride (SiNx) or silicon oxide (SiO2).

The interlayer insulating layer 160 has contact holes 61, 62, 63, 64, 65, 66, 67, and 68. Metal data lines 171, 172, 174, 175, and 179, which include a data line 171, a driving voltage line 172 including a second storage electrode 178, a driving connecting member 174, an initialization connecting member 175, and a light emission control connecting member 179 is formed on the interlayer insulating layer 160. The metal data lines 171, 172, 174, 175, and 179 can be formed in multiple layers in which metal layers formed of any one of copper (Cu), copper alloy, aluminum (Al), aluminum alloy, molybdenum (Mo), and molybdenum alloy are stacked, and can, for example, be formed of a triple layer of titanium/aluminum/titanium (Ti/Al/Ti), molybdenum/aluminum/molybdenum (Mo/Al/Mo), molybdenum/copper/molybdenum (Mo/Cu/Mo), or the like.

The data line 171 is connected to the switching source electrode 136b through the contact hole 62 formed in the gate insulating layer 140 and the interlayer insulating layer 160, and the first driving voltage line 172a partially extends to form a first upper storage electrode 178.

The portion 171bp of the adjacent data line 171b of the data line 171 overlaps the driving drain electrode 137a of the current pixel to form the first holding capacitor Ch1, and the first holding capacitor Ch1 obtains the predetermined load from the adjacent data line 171b, thereby minimizing the vertical line defect. Further, the other expansion 172p of the first driving voltage line 172 overlaps the driving source electrode 136a to form the second holding capacitor Ch2. The second holding capacitor Ch2 prevents the parasitic capacitor between the current data line 171a and the driving source electrode 136a, thereby minimizing the horizontal line defect.

One end of the driving connecting member 174 is connected to the first storage electrode 155a through the contact hole 61 formed in the interlayer insulating layer 160. The other end of the driving connecting member 174 is connected to the compensation drain electrode 137c and the initialization drain electrode 137d through the contact hole 63 formed in the gate insulating layer 140 and the interlayer insulating layer 160.

The initialization connecting member 175 is connected to the initialization source electrode 136d through the contact hole 64 formed in the gate insulating layer 140 and the interlayer insulating layer 160. Also, the light emission control connecting member 179 is connected to the light emission drain electrode 137f through the contact hole 66 formed in the gate insulating layer 140 and the interlayer insulating layer 160.

A passivation layer 180 is formed on the metal data lines 171, 172, 174, 175, and 179, and the interlayer insulating layer 160. The passivation layer 180 covers the metal data lines 171, 172, 174, 175, and 179 to be flatten such, so that the pixel electrode 191 can be formed on the passivation layer 180 without a step. The passivation layer 180 can be formed of a stacked layer of an organic material such as polyacrylates resin, polyimides resin, or the like, or a stacked layer of an organic material and an inorganic material.

The pixel electrode 191 and an initialization voltage line 192 are formed on the passivation layer 180. The light emission control connecting member 179 is connected to the pixel electrode 191 through the contact hole 81 formed in the passivation layer 180, and the initialization connecting member 175 is connected to the initialization voltage line 192 through the contact hole 82 formed in the passivation layer 180.

A pixel definition layer (PDL) 350 covering the passivation layer 180, the initialization voltage line 192, and the edge of the pixel electrode 191 is formed thereon. The pixel definition layer 350 has a pixel opening 351 exposing the pixel electrode 191. The pixel definition layer 350 can be formed of organic materials such as polyacrylates resin, polyimides resin, and the like, and silica-based organic materials.

An organic emission layer 370 is formed on the pixel electrode 191 exposed through the pixel opening 351, and a common electrode 270 is formed on the organic emission layer 370. The common electrode 270 is also formed on the pixel defined layer 350 over the pixels PX. As such, the OLED including the pixel electrode 191, the organic emission layer 370, and the common electrode 270 is formed.

Here, the pixel electrode 191 is an anode, which is a hole injection electrode, and the common electrode 270 is a cathode, which is an electron injection electrode. However, the exemplary embodiment according to the present disclosure is not necessarily limited thereto, and the pixel electrode 191 can be the cathode and the common electrode 270 can be the anode according to a driving method of the foldable display device. Holes and electrons are injected into the organic emission layer 370 from the pixel electrode 191 and the common electrode 270, respectively, and excitons acquired by combining the injected holes and electrons fall from an excitation state to a ground state.

The organic emission layer 370 is formed of a low-molecular organic material or a high-molecular organic material, such as poly(3,4-ethylenedioxythiophene) (PEDOT). Further, the organic emission layer 370 can be formed with multiple layers, including at least one of an emission layer, a hole injection layer (HIL), a hole transporting layer (HTL), an electron transporting layer (ETL), and an electron injection layer (EIL). When the organic emission layer 370 includes all of the layers, the hole injection layer is formed on the pixel electrode 191, which is the positive electrode, and the hole transporting layer, the light emission layer, the electron transporting layer, and the electron injection layer are sequentially laminated thereon.

The organic emission layer 370 can include a red organic emission layer emitting red light, a green organic emission layer emitting green light, and a blue organic emission layer emitting blue light. The red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel. A red color filter, a green color filter, and a blue color filter are formed for each pixel to implement the color images. As another example, a white organic emission layer emitting white light is formed on all of the red pixel, the green pixel, and the blue pixel. The red color filter, the green color filter, and the blue color filter are formed for each pixel to implement the color images. When the color images are implemented by using the white organic emission layer and the color filters, a deposition mask for respectively depositing the red organic emission layer, the green organic emission layer, and the blue organic emission layer on individual pixels, i.e., the red pixel, the green pixel, and the blue pixel, are not used.

The white organic emission layer described in another example can, of course, be formed by one organic emission layer, and it even includes a configuration that can emit white light by laminating a plurality of organic emission layers. As an example, the white organic emission layer can include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (not shown) protecting the OLED can be formed on the common electrode 270, and the encapsulation member can be sealed to the substrate 110 by a sealant and can be formed of various materials such as glass, quartz, ceramic, plastic, and a metal. On the other hand, a thin film encapsulation layer can be formed on the common electrode 270 by depositing the inorganic layer and the organic layer with the usage of the sealant.

While the inventive technology has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light-emitting diode (OLED) display comprising:
    a substrate;
    a scan line formed over the substrate and configured to provide a scan signal;
    a data line crossing the scan line and configured to provide a data voltage;
    a driving voltage line crossing the scan line and configured to provide a driving voltage;
    a switching transistor electrically connected to the scan line and the data line;
    a driving transistor electrically connected to the switching transistor and including a driving gate electrode, a driving source electrode, and a driving drain electrode;
    a storage capacitor including i) a first storage electrode formed over the driving transistor and ii) the driving gate electrode as a second storage electrode, wherein the second storage electrode overlaps the first storage electrode in the depth dimension of the OLED display and extends from the driving voltage line; and
    an OLED electrically connected to the driving transistor, wherein the driving drain electrode overlaps a first portion of the data line to form a first holding capacitor.

2. The OLED display of claim 1, wherein the data line includes i) a current data line configured to transmit a data signal to a current pixel and ii) an adjacent data line separated from the data line and configured to transmit an adjacent data signal to an adjacent pixel, and wherein the first holding capacitor includes:
    the driving drain electrode as a first lower holding electrode; and
    a first upper holding electrode overlapping the first lower holding electrode in the depth dimension of the OLED display, wherein the first upper holding electrode includes the a portion of the adjacent data line.

3. The OLED display of claim 2, wherein the first upper holding electrode protrudes towards the data line a predetermined distance.

4. The OLED display of claim 2, wherein the driving source electrode overlaps the a second portion of the driving voltage line in the depth dimension of the OLED display to form a second holding capacitor.

5. The OLED display of claim 4, wherein the second holding capacitor includes:
    the driving source electrode as a second lower holding electrode; and
    a second upper holding electrode overlapping the second lower holding electrode in the depth dimension of the OLED display.

6. The OLED display of claim 5, wherein the switching and driving transistors respectively include switching and driving channels, wherein the OLED display further comprises a semiconductor including the switching and driving channels formed over the substrate and separated from each other, wherein the driving channel overlaps the driving gate electrode, and wherein the driving channel is curved.

7. The OLED display of claim 6, wherein the first and second lower holding electrodes are formed on the same layer as the driving channel.

8. The OLED display of claim 7, further comprising:
    a gate insulating layer covering the semiconductor; and
    an interlayer insulating layer covering the gate insulating layer, wherein the first and second upper holding electrodes are formed over the interlayer insulating layer.

9. The OLED display of claim 8, wherein the scan line is formed on the same layer as the first storage electrode, and wherein the data line and the second storage electrode are formed over the interlayer insulating layer.

10. The OLED display of claim 9, wherein the driving voltage line includes a first driving voltage line substantially parallel to the data line and a second driving voltage line crossing the data line, wherein the first driving voltage line is formed on the same layer as the data line, and wherein the second driving voltage line is formed on the same layer as the scan line.

11. The OLED display of claim 10, wherein the OLED includes a pixel electrode electrically connected to the driving transistor an organic emission layer formed on the pixel electrode and a common electrode formed on the organic emission layer, and
    wherein the OLED display further comprises an initialization voltage line formed on the same layer as the pixel electrode and configured to provide an initialization voltage to initialize the driving transistor.

* * * * *